(12) United States Patent
Meinhold et al.

(10) Patent No.: US 12,043,539 B2
(45) Date of Patent: Jul. 23, 2024

(54) SENSOR SYSTEM WITH A MICROELECTROMECHANICAL SENSOR ELEMENT AND METHOD FOR PRODUCING A SENSOR SYSTEM

(71) Applicant: Infineon Technologies Dresden GmbH & Co. KG, Dresden (DE)

(72) Inventors: Dirk Meinhold, Dresden (DE); Steffen Bieselt, Wehlen (DE); Claudia Hengst, Dresden (DE); Daniel Koehler, Chemnitz (DE); Erhard Landgraf, Dresden (DE); Sebastian Pregl, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 77 days.

(21) Appl. No.: 17/658,465

(22) Filed: Apr. 8, 2022

(65) Prior Publication Data
US 2022/0348453 A1 Nov. 3, 2022

(30) Foreign Application Priority Data
Apr. 29, 2021 (DE) .......................... 102021111094.7

(51) Int. Cl.
*B81B 3/00* (2006.01)
*H01L 27/12* (2006.01)

(52) U.S. Cl.
CPC ........ *B81B 3/0021* (2013.01); *H01L 27/1203* (2013.01); *B81B 2201/0235* (2013.01); *B81B 2201/0242* (2013.01)

(58) Field of Classification Search
CPC ............. H01L 27/1203; H01L 27/1207; B81B 3/0021; B81B 2201/0235; B81B 2201/0242
USPC ............................................. 257/415; 438/50
See application file for complete search history.

(56) References Cited

U.S. PATENT DOCUMENTS

| | | | |
|---|---|---|---|
| 8,426,233 B1 | 4/2013 | Lei et al. | |
| 2005/0227401 A1 | 10/2005 | Lee et al. | |
| 2013/0168852 A1 | 7/2013 | Liang et al. | |
| 2014/0090485 A1* | 4/2014 | Feyh et al. | G11L 9/0061 73/862 |
| 2014/0361387 A1 | 12/2014 | Meyer et al. | |
| 2016/0377497 A1 | 12/2016 | Nackaerts et al. | |
| 2017/0089783 A1 | 3/2017 | Han et al. | |
| 2020/0131028 A1 | 4/2020 | Cheng et al. | |

FOREIGN PATENT DOCUMENTS

| | | |
|---|---|---|
| DE | 102006047203 A1 | 4/2008 |
| DE | 102012013096 A1 | 1/2014 |
| DE | 102012217979 A1 | 4/2014 |
| DE | 112014004867 T5 | 7/2016 |
| WO | 2011118786 A1 | 9/2011 |
| WO | 2015/154173 A1 | 10/2015 |

* cited by examiner

*Primary Examiner* — Thinh T Nguyen
(74) *Attorney, Agent, or Firm* — Harrity & Harrity, LLP

(57) ABSTRACT

A sensor system with a first semiconductor die part and with a second semiconductor die part is proposed, wherein the first semiconductor die part has a microelectromechanical sensor element, wherein the second semiconductor die part covers the microelectromechanical sensor element, wherein the second semiconductor die part has a via for electrically contacting the microelectromechanical sensor element, in particular directly. A method for producing a sensor system is also proposed.

20 Claims, 14 Drawing Sheets

SENSOR SYSTEM WITH A MICROELECTROMECHANICAL SENSOR ELEMENT AND METHOD FOR PRODUCING A SENSOR SYSTEM

CROSS REFERENCE TO RELATED APPLICATION

This application claims priority to German Patent Application No. 102021111094.7 filed on Apr. 29, 2021, the content of which is incorporated by reference herein in its entirety.

BACKGROUND

For controlling microelectromechanical systems (MEMS), integrated circuits (ICs) are commonly used, which are produced based on CMOS (complementary metal-oxide-semiconductor) technology. Often, the MEMS and the ICs have contact pads that can be used to wire them together. The contact pads typically occupy a significant portion of the total surface area of the ICs and/or MEMS and limit the further miniaturization of sensor systems based on microelectromechanical sensor elements.

The US patent 2020/0131028 A1 proposes an integrated CMOS-MEMS component which has a CMOS structure, a cap structure, and a MEMS structure. The CMOS structure, which is produced on a first substrate, has at least one conductive layer. The cap structure has through holes that run through the cap structure. On a first side of the cap structure an insulation layer is deposited, and on the second side of the cap structure a conductive connection layer is deposited. The MEMS structure is deposited between the first substrate and the cap structure. The integrated CMOS-MEMS component also has a conductive connector that passes through one of the through holes and an opening in the insulation layer. The conductive connector forms an electrically conductive path from the conductive connection layer to a conductive layer of the CMOS structure.

The connectors from the conductive connection layer to the conducting layer of the CMOS structure, arranged at the sides of the MEMS elements of the MEMS structure, further limit the possible miniaturization of sensor systems based on microelectromechanical sensor elements.

Some implementations described herein relate to a sensor system that can be more highly miniaturized and a method for its production.

SUMMARY

A sensor system is proposed having a first semiconductor die part and a second semiconductor die part, wherein the first semiconductor die part comprises a microelectromechanical sensor element. The second semiconductor die part covers the microelectromechanical sensor element. The second semiconductor die part has a via for electrically contacting the microelectromechanical sensor element. In some implementations, the via may directly contact the microelectromechanical sensor element. Due to these via contacts, the resulting lateral dimensions of the sensor system can be smaller than in conventional sensor systems.

In a first implementation of the sensor system, the vias extend through a contact surface between the first semiconductor die part and the second semiconductor die part. Such a via can enable a particularly reliable electrically conductive connection to the microelectromechanical sensor element.

A further implementation of the sensor system provides that the second semiconductor die part has a semiconductor device, wherein the semiconductor component is electrically conductively connected to the microelectromechanical sensor element using the via. In some implementations, the semiconductor device may be a transistor, for example a field effect transistor, fabricated in particular in CMOS technology, or a bipolar transistor. In some implementations, the semiconductor device may be a diode. For example, the semiconductor device may be a photodiode or a light-emitting diode. The integration of the semiconductor device and the microelectromechanical sensor element can enable further miniaturization of the sensor system. The use of optical semiconductor devices can enable in particular a contactless control of the sensor system. The semiconductor device can be a vertical or lateral semiconductor device.

In some implementations, the semiconductor device can be part of an integrated semiconductor circuit for evaluating the microelectromechanical sensor element.

In some implementations, the semiconductor device is part of a protective system for the microelectromechanical sensor element against electrostatic discharge. The semiconductor device can therefore be part of the ESD (electrostatic discharge) protection. This can contribute to ensuring a longer service life.

In some implementations, the semiconductor device can be part of a memory for storing calibration data of the microelectromechanical sensor element. The provision of the calibration data directly in the sensor system increases the reliability that the correct calibration data will be assigned to the correct microelectromechanical sensor element during operation.

In some implementations, the semiconductor device comprises a temperature sensor. The temperature sensor can allow the temperature to be measured near the microelectromechanical sensor element. This temperature can be used to compensate for temperature-related changes in the measured values from the microelectromechanical sensor element.

For example, the microelectromechanical sensor element may have an acceleration sensor element and/or a vibrating structure gyroscope (or Coriolis vibratory gyroscope, often also simply called a gyroscope for short).

The via can be directly connected in an electrically conducting manner to a stator and/or an armature of a rotor of the acceleration sensor element or to the vibrating structure gyroscope. In some implementations, an intermediate layer, for example a metallic intermediate layer, in the first semiconductor die part can be omitted.

In some implementations, the second semiconductor die part can have an integrated sensor element. For example, the second semiconductor die part may include a pressure sensor element. The pressure sensor element can be both a capacitive and a piezoresistive pressure sensor element. The integrated sensor element can also be a magnetic sensor element. The integrated sensor element can also have a temperature sensor element and/or a humidity sensor element. The integrated sensor element can be produced with a process that is compatible with the production of integrated circuits. The integrated sensor element can be produced, for example, after the first semiconductor wafer has been connected to the second semiconductor wafer and the via connections have been made. To produce the integrated sensor element a so-called Venezia process can be used, as described, for example, in DE 10 2019 201 285 A1. In some implementations, high process temperatures can be used in the production of the integrated sensor element without affecting the functionality of the microelectromechanical sensor element or its electrical connection. The same can apply to the production of the semiconductor device described above. A Venezia process can be used for producing a piezoresistive pressure sensor element.

In some implementations, the sensor system can have a contact pad, wherein the contact pad is arranged on the side of the second semiconductor die part opposite one or the contact surface, wherein the contact pad is electrically conductively connected to the via. The contact pad can be used, for example, to electrically connect the sensor system to a printed circuit board or housing contacts using wire connections.

Furthermore, a method for producing a sensor system is disclosed, wherein a first semiconductor wafer is provided, wherein a microelectromechanical sensor element is structured in the first semiconductor wafer, wherein a second semiconductor wafer is provided, wherein the microelectromechanical sensor element is covered by connecting the first semiconductor wafer and the second semiconductor wafer, wherein a hole is etched through the second semiconductor wafer from a side opposite the contact surface (605) between the first semiconductor wafer and the second semiconductor wafer.

The hole can be etched through the contact surface (605). In some implementations, the hole is etched only up to the contact surface. In some implementations, the materials of the first semiconductor wafer and the second semiconductor wafer at the contact surface can differ, so that the etching process stops or the etching speed at least decreases substantially due to the material difference.

The hole can be provided with a side-wall insulation. In this way, the via contact to the microelectromechanical sensor element can also be facilitated using a conductive layer of the second semiconductor wafer.

For this purpose, the side-wall insulation can be removed from a bottom of the hole. Then, a via can be produced in the hole. For this purpose, a conductively doped semiconductor material, for example, polycrystalline silicon, can be deposited in the hole. In some implementations, the hole may be filled with a metal or a metallic compound. Tungsten, for example, can be used for this purpose.

After the connection of the first semiconductor wafer and the second semiconductor wafer, a semiconductor device can be produced in the second semiconductor wafer. In some implementations, the materials used up to the connection of the first semiconductor wafer and the second semiconductor wafer can enable the processing of the composite wafer in a CMOS process line of a semiconductor fabrication facility. The limitations with regard to the thermal budget that is available for the production of the semiconductor device can be minimal.

After the connection of the first semiconductor wafer and the second semiconductor wafer, an integrated sensor element, for example, a pressure sensor element, can be produced in the second semiconductor wafer. Possible variants and advantages have already been explained above.

The first semiconductor wafer and/or the second semiconductor wafer can be an SOI wafer.

BRIEF DESCRIPTION OF THE DRAWINGS

Examples will now be explained in more detail using the drawings. In the drawings, schematically in each case.

DETAILED DESCRIPTION

Figure 1:
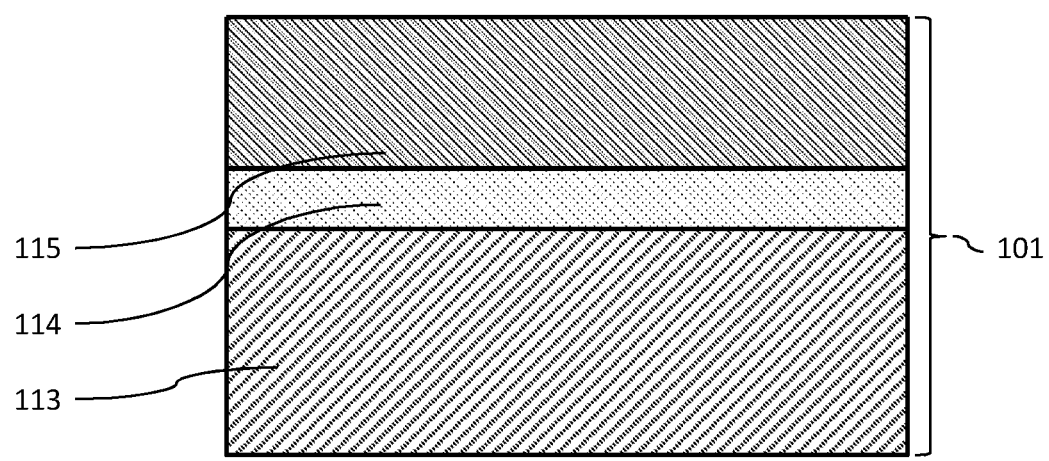
FIG. 1 shows a first semiconductor wafer.

FIG. 1 shows a first semiconductor wafer 101. The first semiconductor wafer 101 can be an SOI wafer (silicon-on-insulator wafer) containing a substrate 113, e.g., of monocrystalline or polycrystalline silicon, an insulation layer 114, e.g., of silicon oxide or sapphire, and a semiconductor layer 115, e.g., a thin layer of a monocrystalline semiconductor material, e.g., silicon.

However, the first semiconductor wafer 101 can also have a substrate 113 on which an insulation layer 114, e.g., of silicon oxide, is deposited, on which a polycrystalline semiconductor layer, e.g., of silicon, is then deposited.

Figure 2:
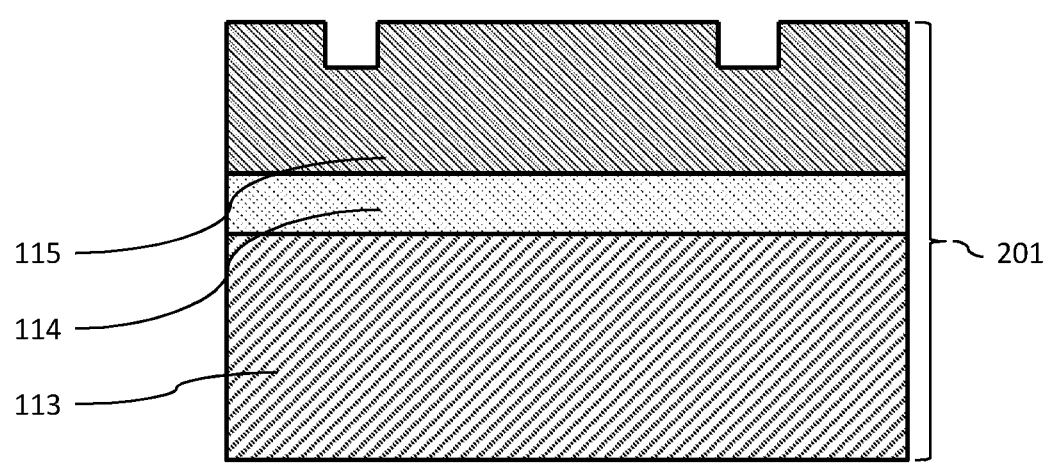
FIG. 2 shows the processed first semiconductor wafer of FIG. 1.

Using a first lithography step, a first structure can be introduced into the semiconductor layer, as shown in FIG. 2. The structure shown in the example of the first semiconductor wafer 201 shown in FIG. 2 can be used in particular to generate an asymmetry, in which regions which will later form electrodes of the microelectromechanical sensor element are lowered.

Figure 3:
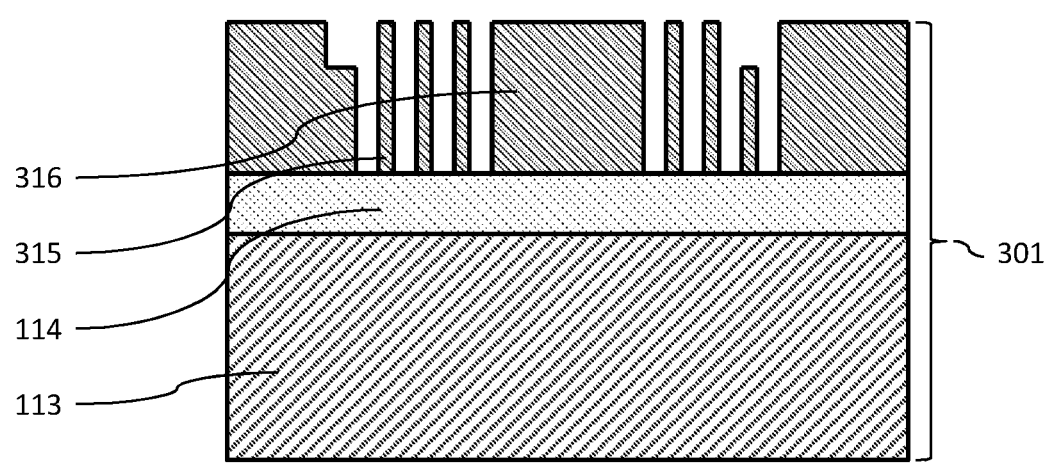
FIG. 3 shows the processed first semiconductor wafer of FIG. 2.

Using a second lithography step, as shown by the first semiconductor wafer 301 depicted in FIG. 3, further structures of a microelectromechanical sensor element, in particular the rotor 315 and the armature 316 of the rotor of an acceleration sensor, can be formed.

Figure 4:
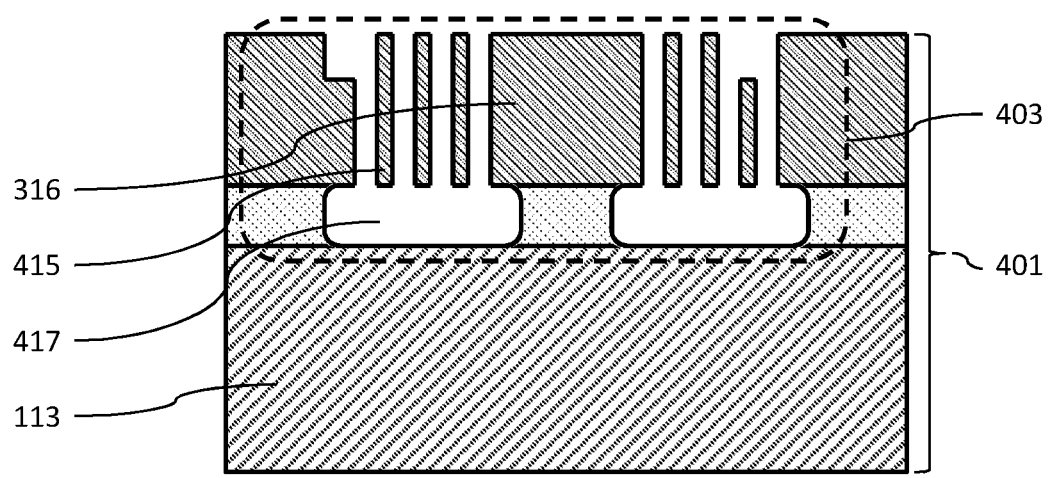
FIG. 4 shows the processed first semiconductor wafer of FIG. 3.

FIG. 4 shows the first semiconductor wafer 401 after a further process step, in which structures of the microelectromechanical sensor element 403, in particular the rotor 415 of the acceleration sensor 403, have been undercut, thereby forming a cavity 417 underneath the rotor 415. Depending on the material of the insulation layer 114, hydrofluoric acid (HF) or xenon fluoride (XeF) can be used for the undercutting.

Figure 5:
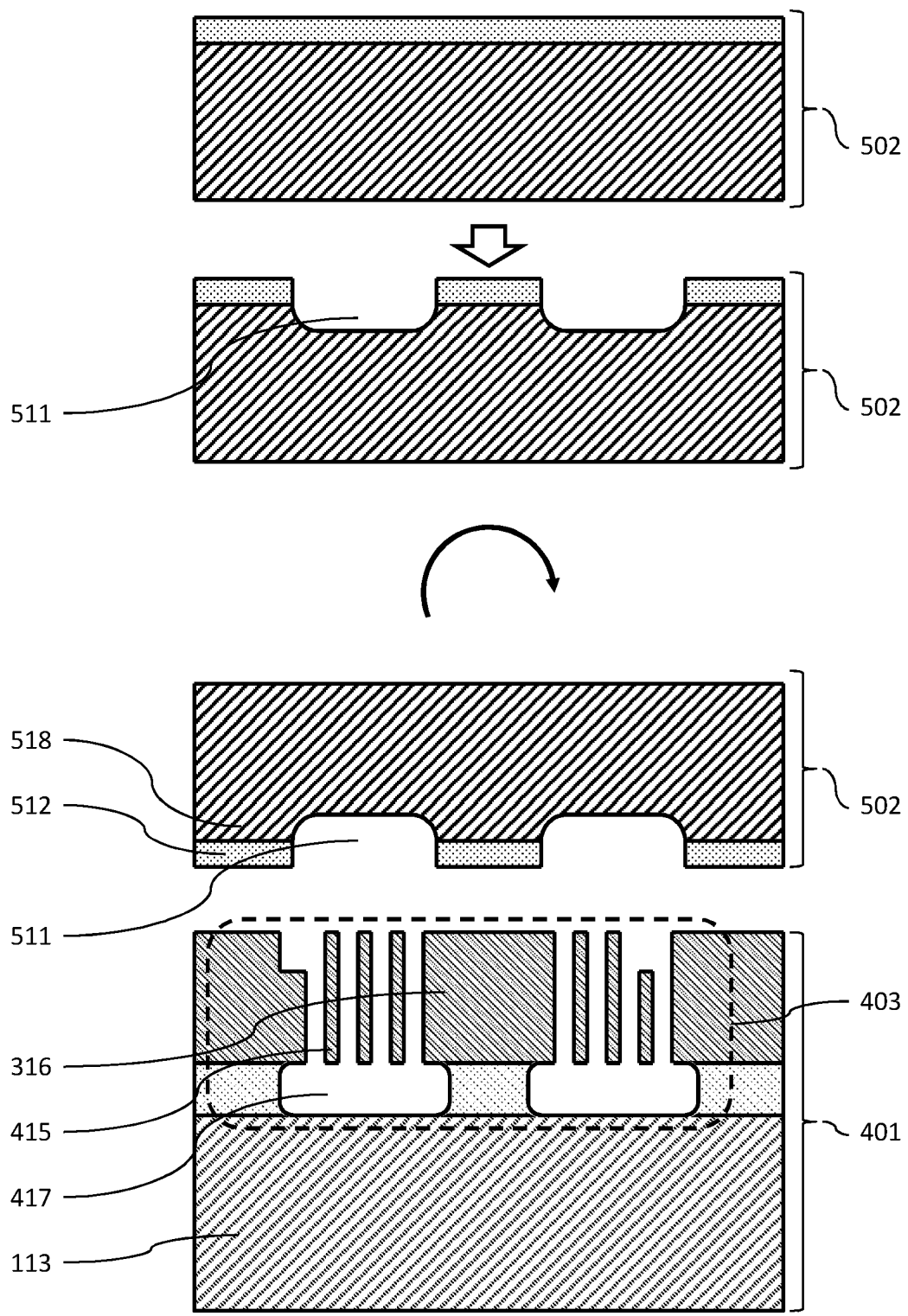
FIG. 5 shows the connection of the first semiconductor wafer of FIG. 4 to a second semiconductor wafer.

In the top half of FIG. 5 a second semiconductor wafer 502 with a semiconductor layer 518 and a dielectric layer 512 is shown. The second semiconductor wafer 502 can also be an SOI wafer. As shown in the top half of FIG. 5, using a third lithography step followed by an etching step, recesses 511 can be formed in a second semiconductor wafer 502. The second semiconductor wafer 502 can then be rotated and connected to the first semiconductor wafer 401. For example, direct bonding, anodic bonding and/or low-temperature anodic bonding can be used for this. In particular, the dielectric layer 512 can be used to connect the second semiconductor wafer 502 to the first semiconductor wafer 401. The recess 511 can be used to form a cavity in which movable elements of the microelectromechanical sensor element 403 can move freely. In some implementations, after the connection of the first semiconductor wafer and the second semiconductor wafer, an epitaxial step of e.g., 20 μm can be carried out to seal the connection laterally on the contact plane.

After the connection of the first semiconductor wafer 401 to the second semiconductor wafer 502, the thickness of the semiconductor layer 518 can be reduced. If the second semiconductor wafer 502 is an SOI wafer, the substrate and the insulation layer of the SOI wafer can be removed. Thus, a semiconductor layer 518 of less than 100 μm thickness can remain.

Using a structuring layer 619 applied to the second semiconductor wafer 502 and produced using a fourth lithography step after the connection of the first semiconductor wafer 401 to the second semiconductor wafer 502, a hole 604 can be etched into the semiconductor layer 518. For this purpose, the hole 604 can reach only as far as the contact surface 605 between the second semiconductor wafer 502 and the first semiconductor wafer 401. In the example implementation of FIG. 6, the hole 604 is etched through the contact surface 605.

Figure 7:
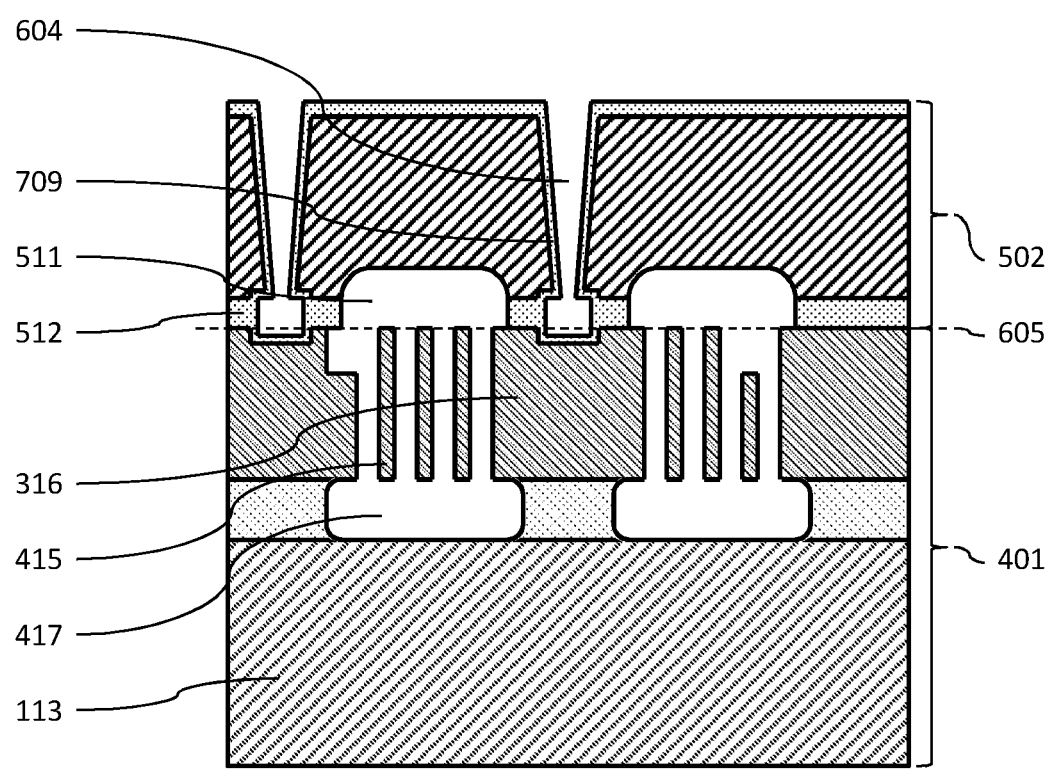
FIG. 7 shows the processed semiconductor wafer composite of FIG. 6.
Figure 8:
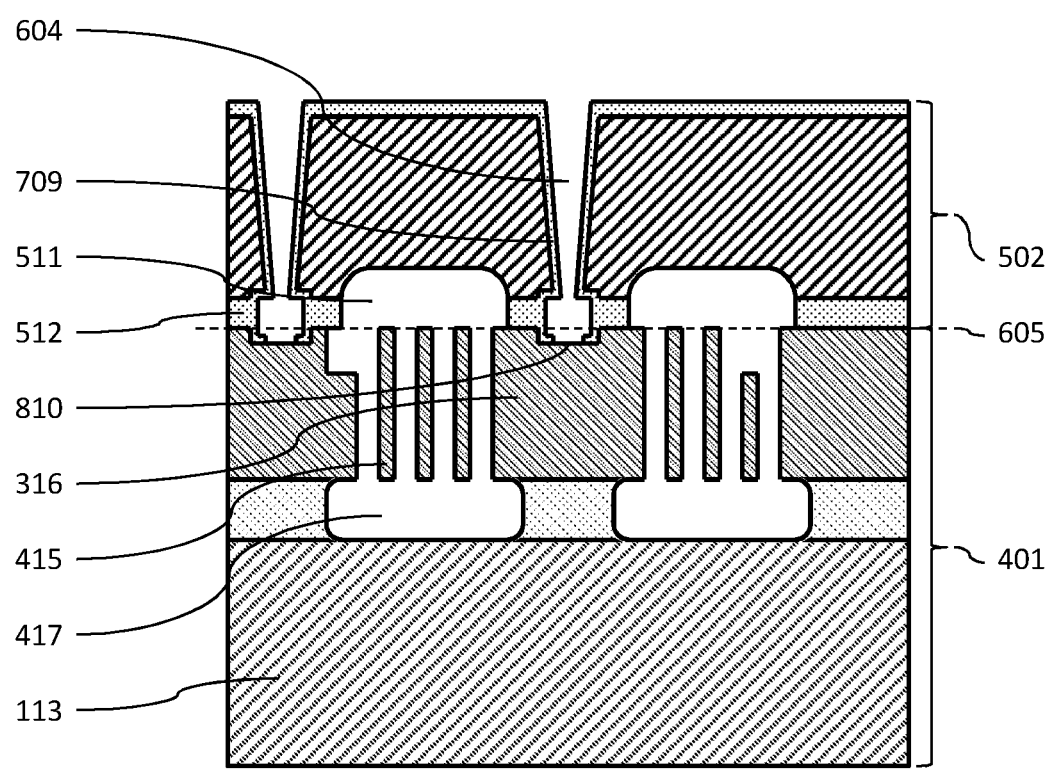
FIG. 8 shows the processed semiconductor wafer composite of FIG. 7.

As shown in FIG. 7, the hole 604 can be provided with a side-wall insulation 709. For example, a thermal oxide can be formed as the side-wall insulation 709. Then, as shown in FIG. 8, the side-wall insulation 709 on the hole bottom 810 can be removed.

Figure 6:
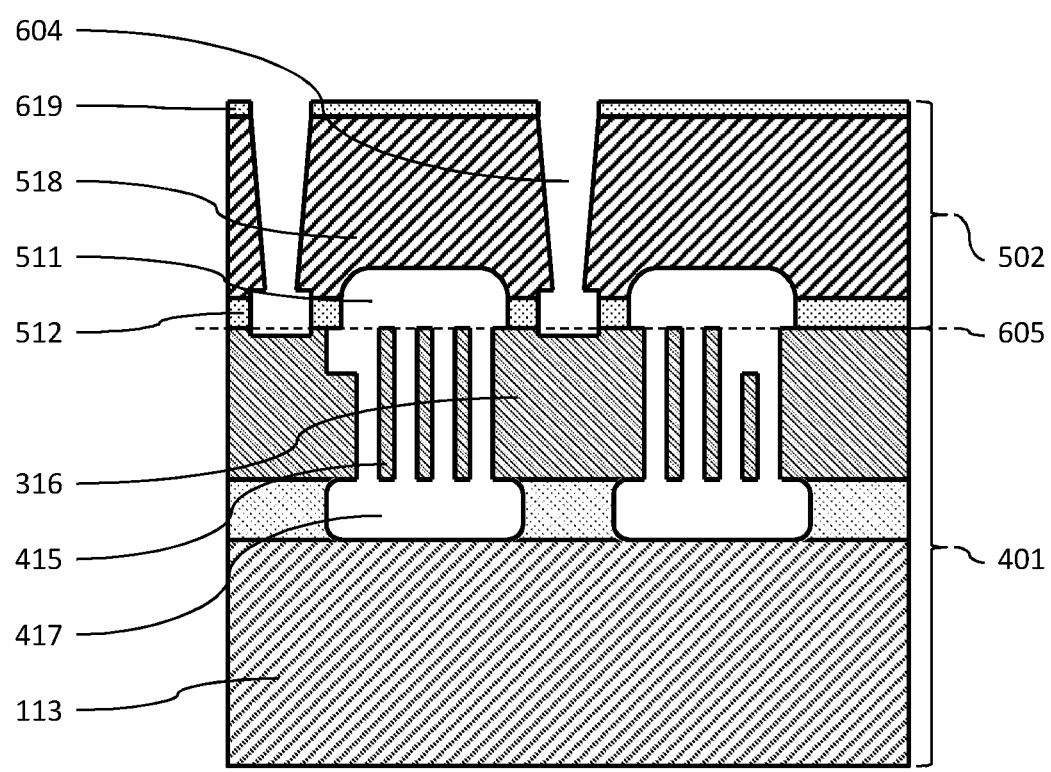
FIG. 6 shows the processed semiconductor wafer composite of FIG. 5.

The steps shown in FIGS. 6 and 7 for producing the holes 604 and the side-wall insulations 709 can also be used to create trenches with side-wall insulations. The trenches can completely insulate regions of the semiconductor layer 518 laterally from other regions of the semiconductor layer 518. These laterally insulated regions, which are also insulated from below by the insulation layer 114, can also be construed as local SOI regions. The local SOI regions may allow circuits integrated into the sensor system to be provided with a higher voltage level.

Figure 9:
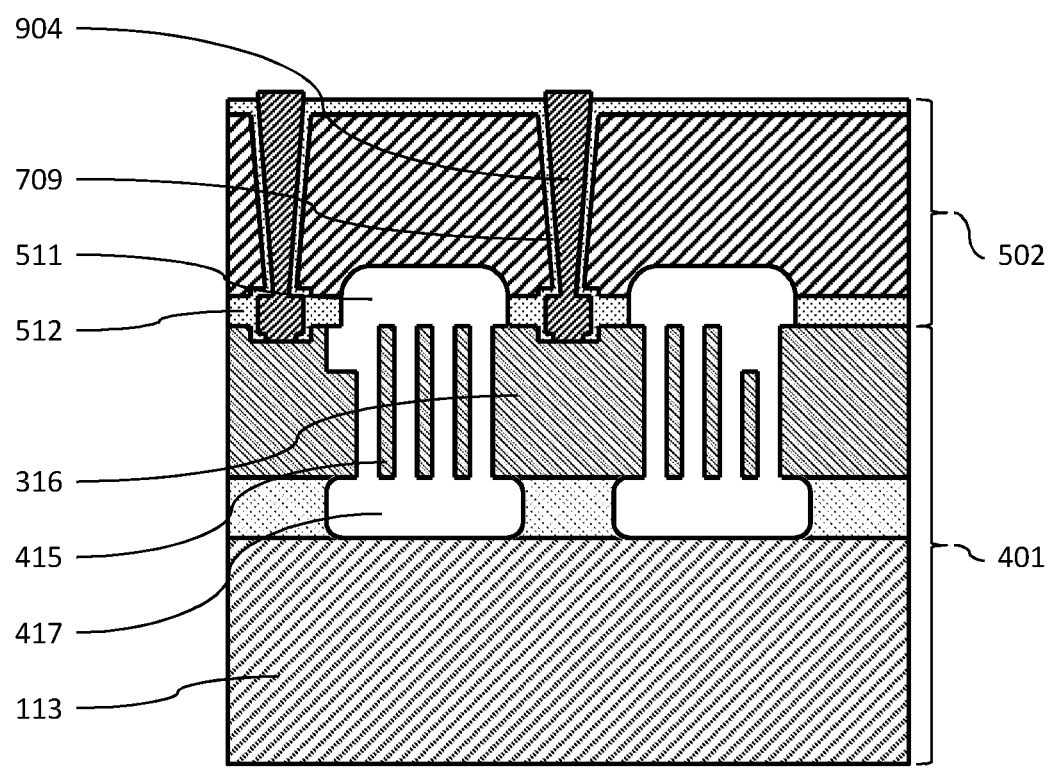
FIG. 9 shows the processed semiconductor wafer composite of FIG. 8.

FIG. 9 illustrates that a via 904 has been produced in the hole 604. The via 904 can be made of metal, e.g., tungsten, copper, or aluminum. A doped semiconductor material, e.g., polycrystalline silicon, can also be used as a material for the via.

Figure 10:
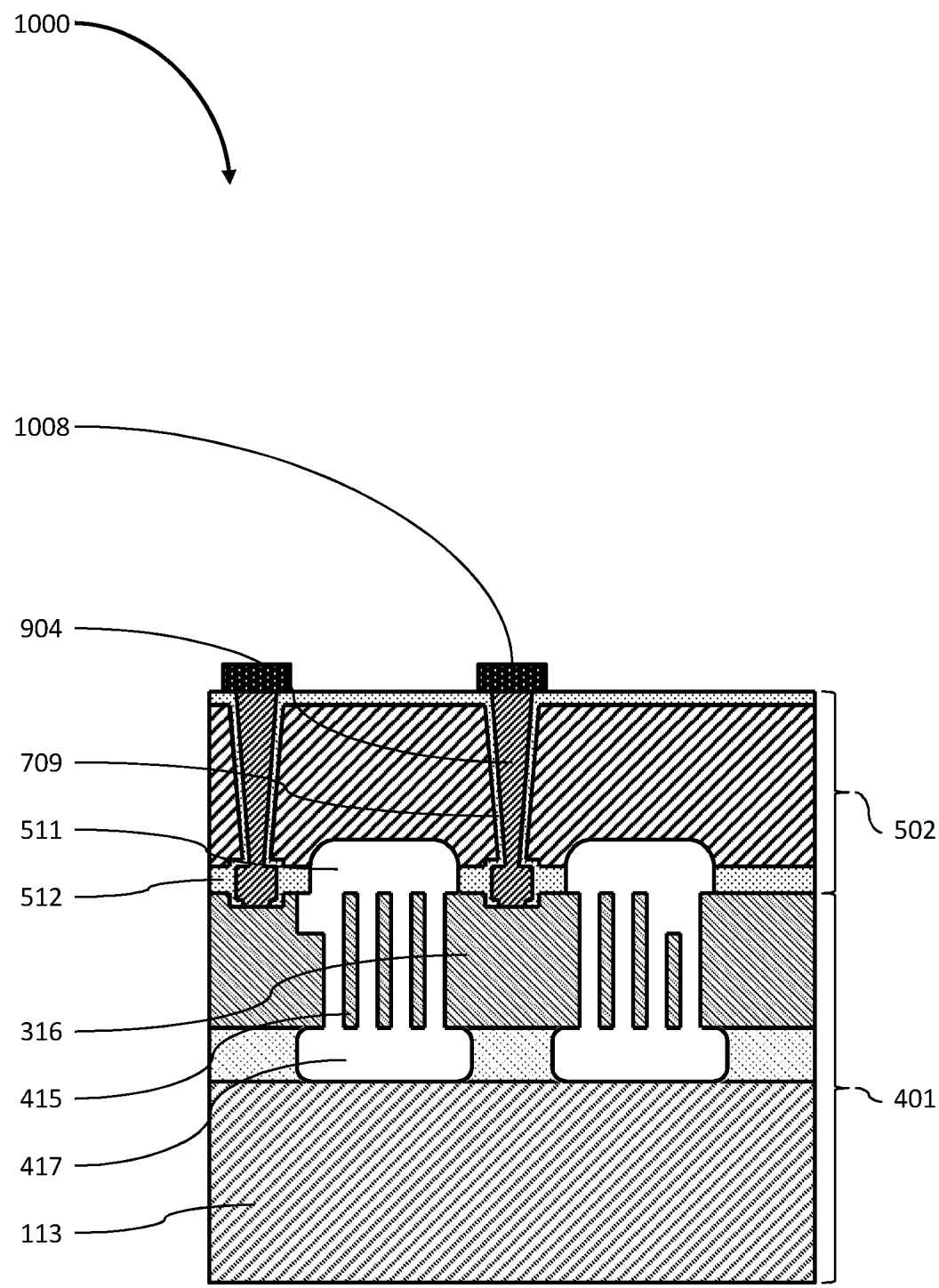
FIGS. 10-12 show example sensor systems, according to one or more implementations described herein.

After leveling the surface of the wafer, a contact pad 1008 can be applied on the surface on the via 904 using a fifth lithography step, as shown in FIG. 10. The wafer can then be split into different semiconductor dies to contain sensor systems 1000. Consequently, a plurality of identical or similar sensor systems 1000 can be produced from a single wafer, which can greatly reduce the fabrication effort. In particular, using the proposed vias and by providing the contact pads 1008 above the microelectromechanical sensor elements, it is possible to reduce the lateral dimensions of the sensor system 1000 compared to conventional sensor systems, so that more sensor systems 1000 can be fabricated from semiconductor wafers of a given size. Furthermore, the sensor system 1000 can be fabricated using only five lithography steps. This can significantly reduce the time required to produce the sensor system 1000 compared to conventional sensor systems. Further lithography steps are not necessary, but can be carried out anyway to allow passivation openings and/or substrate contacts to be made.

Figure 11:
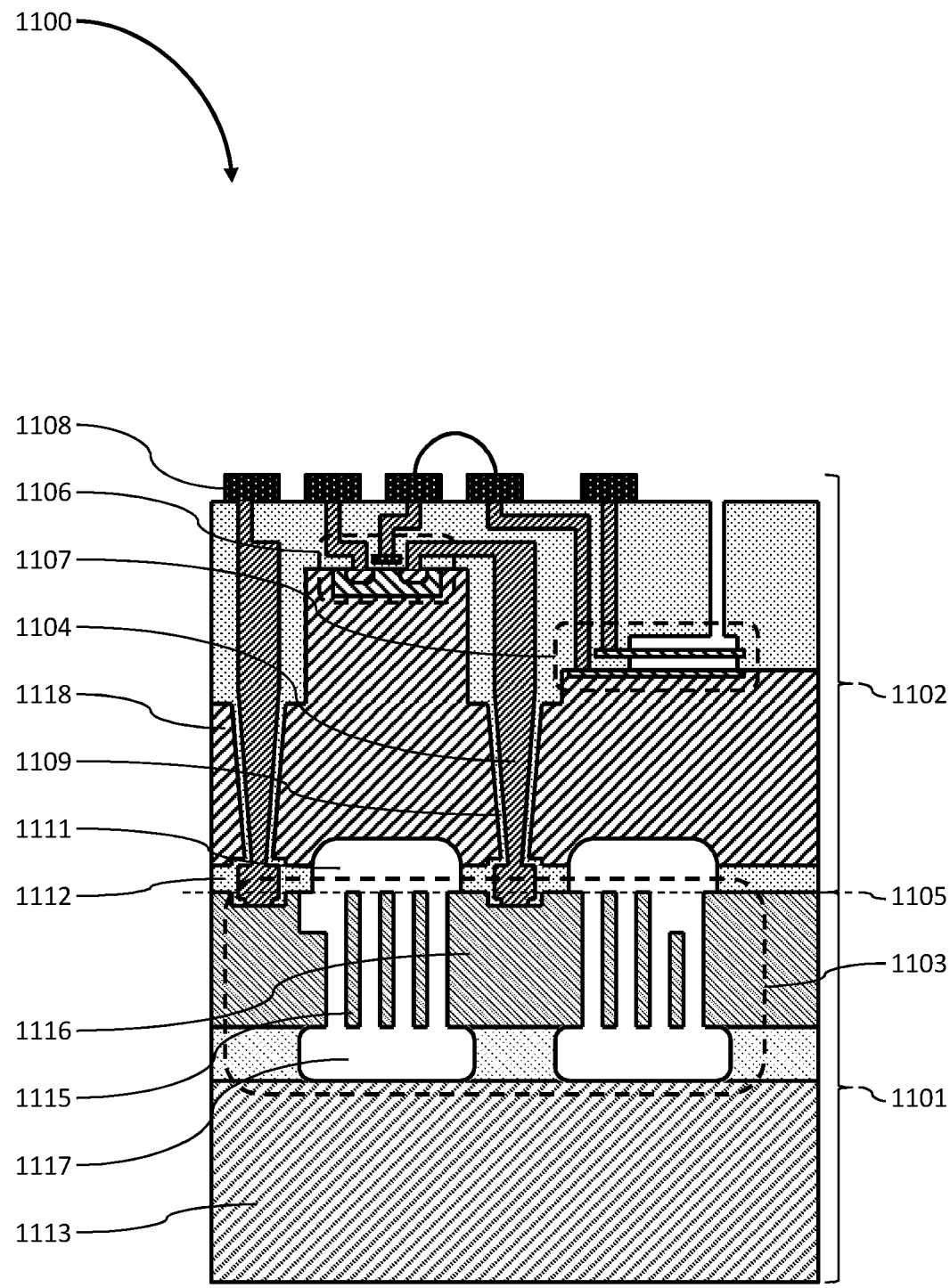

FIG. 11 shows a further example of a sensor system 1100. With regard to the method steps for producing the first semiconductor die part 1101 with the substrate 1113, the cavity 1117, the rotor 1115, the stator 1116 and the microelectromechanical sensor element 1103, reference is made to the corresponding explanations for the sensor system 1000. With regard to the recess 1111, the via 1104, the side-wall insulation 1109 and the contact pad 1108 of the second semiconductor die part 1102, which is connected to the first semiconductor die part 1101 forming a contact surface, the relevant explanations of the sensor system 1000 given above are also referred to.

The sensor system 1100 comprises a semiconductor device 1106, which was fabricated in the second semiconductor wafer after the connection of the first semiconductor wafer, which corresponds to the first semiconductor die part 1101, and the second semiconductor wafer, which corresponds to the second semiconductor die part 1102. In addition, the sensor system 1100 comprises a pressure sensor element 1107. The pressure sensor element 1107 and/or the semiconductor device 1106 and/or the microelectromechanical sensor element 1103 can be electrically interconnected using electrical connections integrated in the second semiconductor die part 1102 and/or using external wiring. The sensor system 1100 can enable the compact integration of different sensor elements. In the sensor system 1100, the pressure sensor element 1107 and the semiconductor component 1106 are arranged in different planes of the second semiconductor die part 1102. Alternatively, the semiconductor device 1106 and the pressure sensor element 1107 can also be arranged in the same planes. In some implementations, at least part of the pressure sensor element 1107 and at least part of the semiconductor device 1106 is produced in a common processing step. This allows the total number of processing steps required for the production of the sensor system 1100 to be further reduced. In some implementations, regions of the semiconductor layer 115 which are not required for the microelectronic sensor element 1103 can also be used as a buried layer for electronic circuits in the second semiconductor die part 1102.

Figure 12:
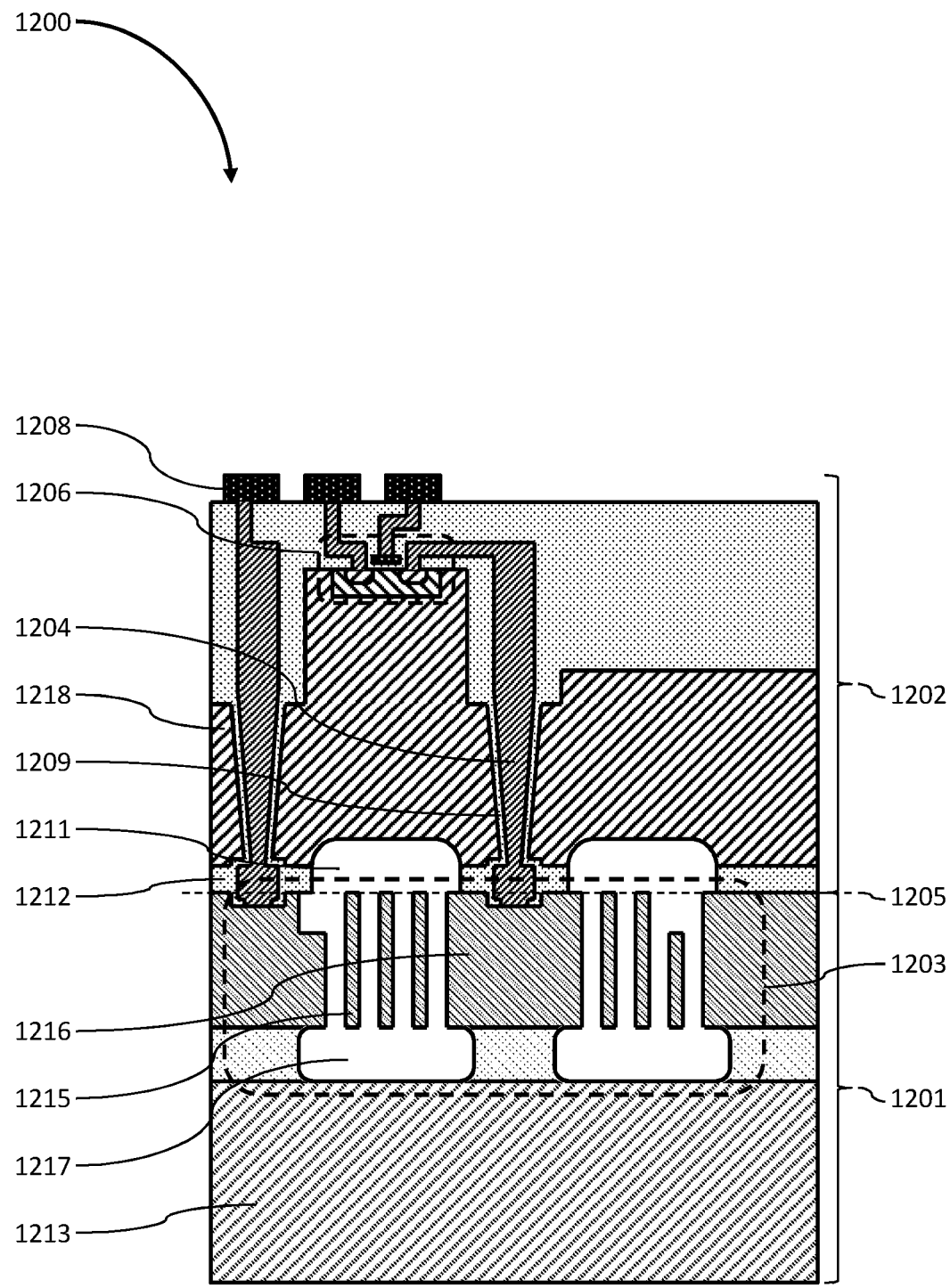

FIG. 12 shows another example of a sensor system 1200. With regard to the elements 1213, 1217, 1215, 1216, 1212, 1211, 1209, 1218, 1204, 1206, 1208, 1201, 1203, 1205, 1202, reference is made to the elements 1113, 1117, 1115, 1116, 1112, 1111, 1109, 1118, 1104, 1106, 1108, 1101, 1103, 1105, 1102 in FIG. 11. Unlike the sensor system 1100, the sensor system 1200 does not have a pressure sensor element. The semiconductor device 1206 is part of an integrated semiconductor circuit for evaluating the microelectromechanical sensor element 1203.

Figure 13:
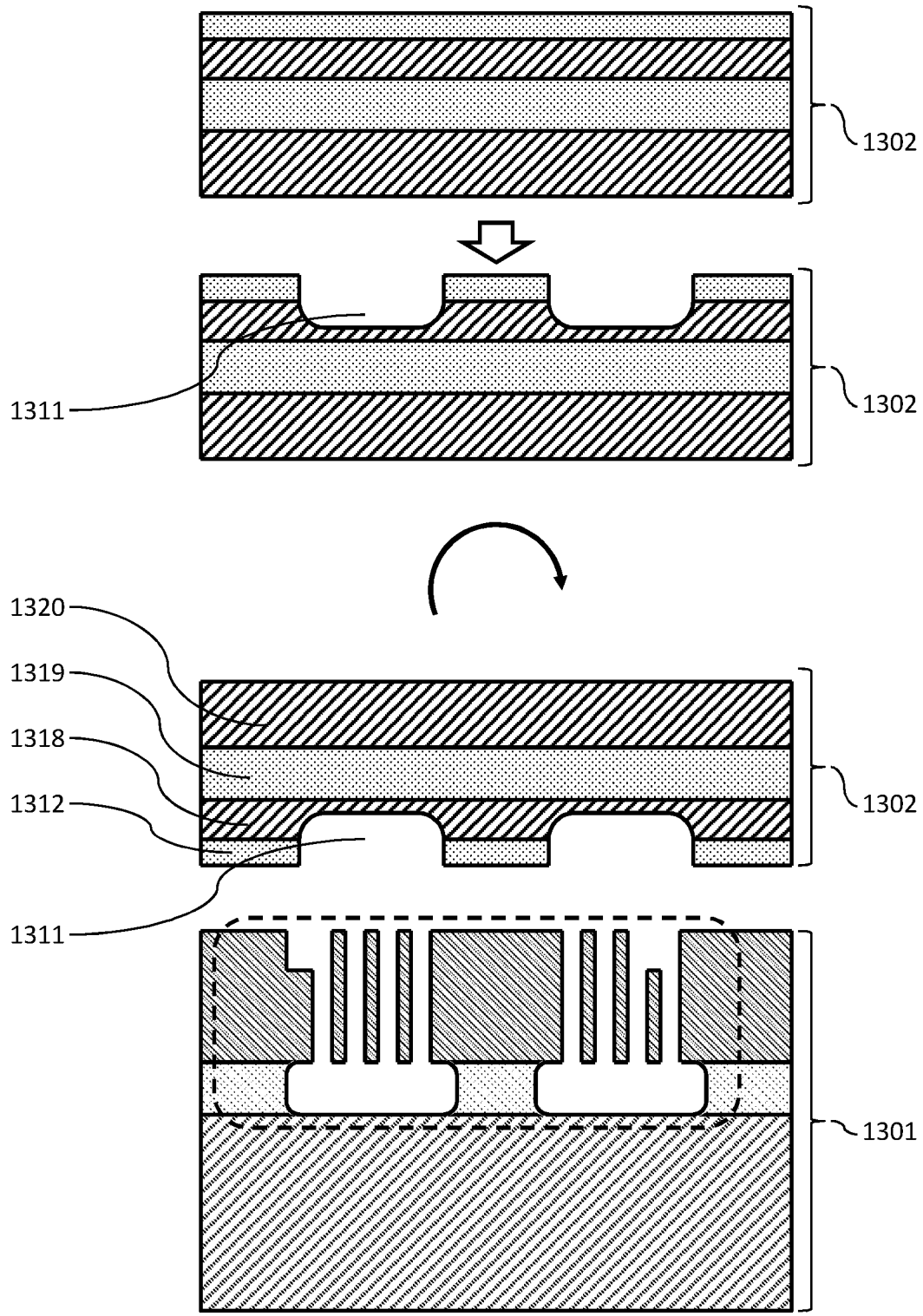
FIGS. 13-15 show example processing steps for producing a sensor system, according to one or more implementations described herein.
Figure 14:
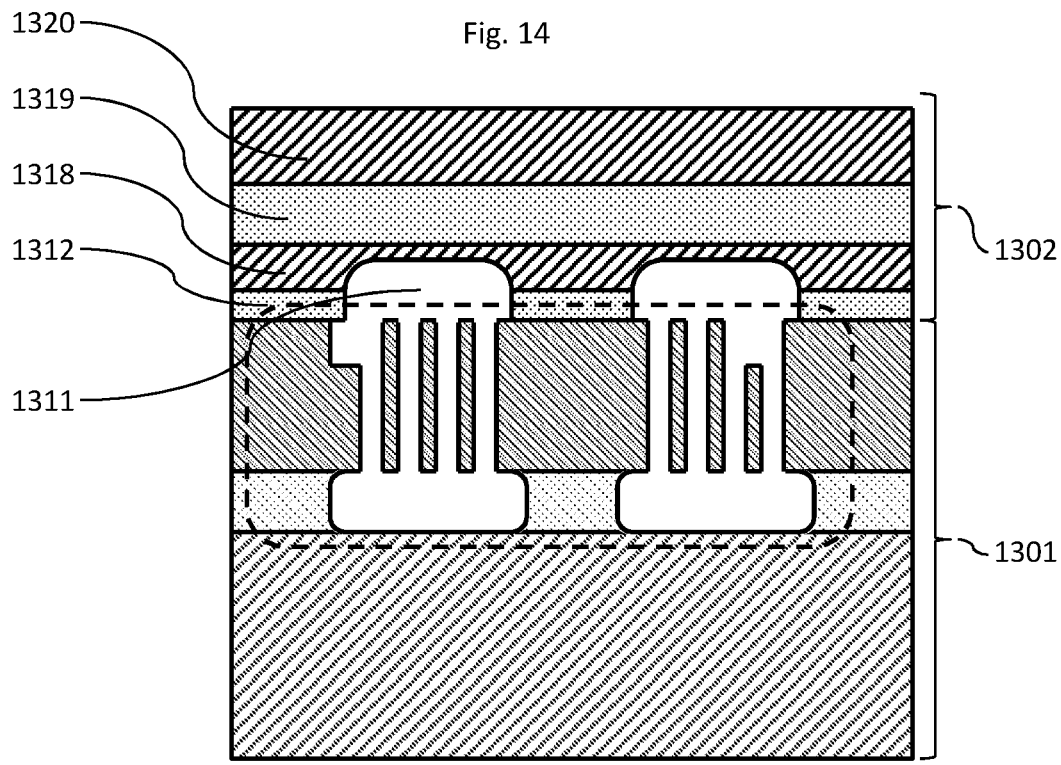
Figure 15:
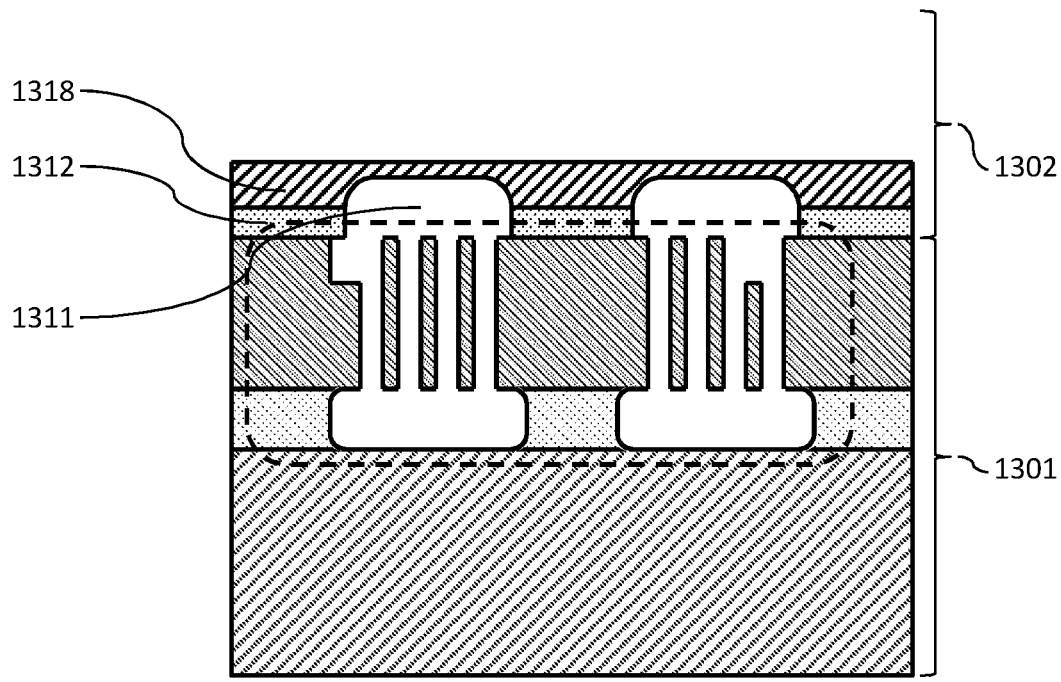

FIGS. 13-15 show example processing steps for producing a sensor system, wherein an SOI wafer is used as the second semiconductor wafer 1302. The SOI wafer has a carrier wafer 1320, an insulation layer 1319 and a thin, monocrystalline semiconductor layer 1318. After the recesses 1311 are created, using the dielectric layer 1312 and the connection of the wafers as shown in FIG. 14, the insulation layer 1319 and the carrier wafer 1320 can be removed so that only the thin semiconductor layer 1318 remains (see FIG. 15). The thin semiconductor layer 1318 can have a thickness of less than 100 μm. The semiconductor layer 1318 can also be characterized by a high uniformity and surface quality, which makes it particularly suitable for producing semiconductor devices using CMOS technologies.

ASPECTS

Some implementations are defined by the following Aspects:

Aspect 1. A sensor system (1100) having a first semiconductor die part (1101), and having a second semiconductor die part (1102), wherein the first semiconductor die part (1101) has a microelectromechanical sensor element (1103), wherein the second semiconductor die part (1102) covers the microelectromechanical sensor element (1103), wherein the second semiconductor die part (1102) has a via (1104) for electrically contacting the microelectromechanical sensor element (1103), in particular directly.

Aspect 2. A sensor system (1100) according to Aspect 1, wherein the via (1104) extends through a contact surface (1105) between the first semiconductor die part (1101) and the second semiconductor die part (1102).

Aspect 3. A sensor system (1100) according to Aspect 1 or 2, wherein the second semiconductor die part (1102) has a semiconductor device (1106), wherein the semiconductor device is connected in an electrically conductive manner to the microelectromechanical sensor element (1103) using the via (1104).

Aspect 4. A sensor system (1100) according to Aspect 3, wherein the semiconductor device (1106) is part of an integrated semiconductor circuit for evaluating the microelectromechanical sensor element (1103).

Aspect 5. A sensor system (1100) according to Aspect 3 or 4, wherein the semiconductor device (1106) is part of a protective system for the microelectromechanical sensor element (1103) against electrostatic discharge.

Aspect 6. A sensor system (1100) according to any one of Aspects 3 through 5, wherein the semiconductor device (1106) is part of a memory for storing the calibration data of the microelectromechanical sensor element (1103).

Aspect 7. A sensor system (1100) according to any one of Aspects 3 through 6, wherein the semiconductor device (1106) comprises a temperature sensor.

Aspect 8. A sensor system (1100) according to any one of Aspects 1 through 7, wherein the microelectromechanical sensor element (1103) has an acceleration sensor element and/or a vibrating structure gyroscope.

Aspect 9. A sensor system (1100) according to Aspect 8, wherein the via (1104) is directly connected in an electrically conductive manner to a stator (1116) and/or an armature of a rotor (1115) of the acceleration sensor element.

Aspect 10. A sensor system (1100) according to any one of Aspects 1 through 9, wherein the second semiconductor die part (1102) has an integrated sensor element, in particular a pressure sensor element (1107).

Aspect 11. A sensor system (1100) according to any one of Aspects 1 through 10, wherein the sensor system (1100) has a contact pad (1108), wherein the contact pad (1108) is arranged on the side of the second semiconductor die part (1102) opposite the contact surface (1105), and wherein the contact pad (1108) is electrically conductively connected to the via (1104).

Aspect 12. A method for producing a sensor system (1100), wherein a first semiconductor wafer (101) is provided, wherein a microelectromechanical sensor element (403) is structured in the first semiconductor wafer (101), wherein a second semiconductor wafer (502) is provided, wherein the microelectromechanical sensor element (403) is covered by connecting the first semiconductor wafer (101) and the second semiconductor wafer (502), wherein a hole (604) is etched through the second semiconductor wafer (102) from a side opposite a contact surface (605) between the first semiconductor wafer (101) and the second semiconductor wafer (102).

Aspect 13. A method for producing a sensor system (1100) according to Aspect 12, wherein the hole (604) is etched through the contact surface (605).

Aspect 14. A method for producing a sensor system (1100) according to either of Aspect 12 or Aspect 13, wherein the hole (604) is provided with a side-wall insulation (709).

Aspect 15. A method for producing a sensor system (1100) according to any one of Aspects 12 through 14, wherein the side-wall insulation (709) on a hole bottom of the hole (604) is removed.

Aspect 16. A method for producing a sensor system (1100) according to any one of Aspects 12 through 15, wherein a via is produced in the hole.

Aspect 17. A method for producing a sensor system (1100) according to any one of Aspects 12 through 16, wherein after the connection of the first semiconductor wafer (101) and the second semiconductor wafer (102), a semiconductor device (1106) is produced in the second semiconductor wafer (102).

Aspect 18. A method for producing a sensor system (1100) according to any one of Aspects 12 through 17, wherein after the connection of the first semiconductor wafer (101) and the second semiconductor wafer (102), an integrated sensor element, in particular a pressure sensor element, is produced in the second semiconductor wafer (102).

Aspect 19. A method for producing a sensor system (1100) according to any one of Aspects 12 through 18, wherein the first semiconductor wafer (101) and/or the second semiconductor wafer (102) comprise/s an SOI wafer.

Although specific example implementations have been illustrated and described in this description, persons with current knowledge of the art will recognize that a plurality of alternative and/or equivalent implementations can be chosen as a substitute for the specific example implementations shown and described in this description, without deviating from the scope of the implementation disclosed. It is the intention that this application covers all adaptations or variations of the specific example implementations discussed here. It is therefore intended that this disclosure is limited only by the claims and their equivalents.

What is claimed is:

1. A sensor system comprising:

a first semiconductor die part, and a second semiconductor die part, wherein the first semiconductor die part includes a microelectromechanical sensor element, wherein the second semiconductor die part covers the microelectromechanical sensor element, wherein the second semiconductor die part includes a via for electrically contacting the microelectromechanical sensor element, and wherein the via extends through the second semiconductor die part and through a contact surface provided between the first semiconductor die part and the second semiconductor die part.

2. The sensor system as claimed in claim 1, wherein the second semiconductor die part includes a semiconductor device,
  wherein the via connects the semiconductor device to the microelectromechanical sensor element in an electrically conductive manner.

3. The sensor system as claimed in claim 2, wherein the semiconductor device is included in an integrated semiconductor circuit for evaluating the microelectromechanical sensor element.

4. The sensor system as claimed in claim 2, wherein the semiconductor device is included in a protective system for the microelectromechanical sensor element against electrostatic discharge.

5. The sensor system as claimed in claim 2, wherein the semiconductor device is included in a memory for storing calibration data of the microelectromechanical sensor element.

6. The sensor system as claimed in claim 2, wherein the semiconductor device comprises a temperature sensor.

7. The sensor system as claimed in claim 1, wherein the microelectromechanical sensor element includes one or more of an acceleration sensor element or a vibrating structure gyroscope.

8. The sensor system as claimed in claim 7, wherein the via is directly connected in an electrically conductive manner to one or more of a stator or an armature of a rotor of the acceleration sensor element.

9. The sensor system as claimed in claim 1, wherein the second semiconductor die part includes an integrated sensor element.

10. The sensor system as claimed in claim 1, wherein the sensor system includes a contact pad,
  wherein the contact pad is arranged on a side of the second semiconductor die part opposite the contact surface, and
  wherein the contact pad is electrically conductively connected to the via.

11. The sensor system as claimed in claim 1, wherein the via directly contacts the microelectromechanical sensor element.

12. A sensor system, comprising:
  a microelectromechanical sensor element included in a first semiconductor die part; and
  a semiconductor device included in a second semiconductor die part,
    wherein the second semiconductor die part covers the microelectromechanical sensor element,
    wherein a via extends through the second semiconductor die part and through a contact surface provided between the first semiconductor die part and the second semiconductor die part, and
    wherein the via connects the semiconductor device to the microelectromechanical sensor element in an electrically conductive manner.

13. The sensor system as claimed in claim 12, wherein the semiconductor device is included in an integrated semiconductor circuit for evaluating the microelectromechanical sensor element.

14. The sensor system as claimed in claim 12, wherein the semiconductor device is included in a protective system for the microelectromechanical sensor element against electrostatic discharge.

15. The sensor system as claimed in claim 12, wherein the semiconductor device is included in a memory for storing calibration data of the microelectromechanical sensor element.

16. The sensor system as claimed in claim 12, wherein the semiconductor device comprises a temperature sensor.

17. The sensor system as claimed in claim 12, wherein the microelectromechanical sensor element includes one or more of an acceleration sensor element or a vibrating structure gyroscope.

18. The sensor system as claimed in claim 17, wherein the via is directly connected in an electrically conductive manner to one or more of a stator or an armature of a rotor of the acceleration sensor element.

19. A sensor system, comprising:
  a microelectromechanical sensor element included in a first semiconductor die part; and
  an integrated sensor element included in a second semiconductor die part,
    wherein the second semiconductor die part covers the microelectromechanical sensor element, and
    wherein a via extends through the second semiconductor die part and through a contact surface provided between the first semiconductor die part and the second semiconductor die part.

20. The sensor system as claimed in claim 19, further comprising:
  a contact pad, wherein the contact pad is arranged on a side of the second semiconductor die part opposite the contact surface, and
    wherein the contact pad is electrically conductively connected to the via.

* * * * *